United States Patent
Sugibayashi

(12) 
(10) Patent No.: US 6,335,895 B1
(45) Date of Patent: Jan. 1, 2002

(54) SEMICONDUCTOR STORAGE DEVICE AND SYSTEM USING THE SAME

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/584,665

(22) Filed: Jun. 1, 2000

(30) Foreign Application Priority Data

Jun. 1, 1999 (JP) .......................................... 11-154312

(51) Int. Cl.$^7$ ................................................ G11C 7/00
(52) U.S. Cl. ...................... 365/227; 365/226; 365/228; 365/229
(58) Field of Search ................................. 365/226, 227, 365/228, 229

(56) References Cited

U.S. PATENT DOCUMENTS 5,825,705 A * 10/1998 Tsukude et al. ............. 365/222
5,901,096 A * 5/1999 Inokuchi et al. ............ 365/228
6,021,082 A * 2/2000 Shirai ........................... 365/226
6,101,137 A * 8/2000 Roh ............................. 365/194
6,226,224 B1 * 5/2001 Banba et al. ................ 365/227

FOREIGN PATENT DOCUMENTS

JP          9-63267       3/1997
JP          339961 A   * 12/2000

* cited by examiner

Primary Examiner—Richard Elms
Assistant Examiner—VanThu Nguyen
(74) Attorney, Agent, or Firm—Young & Thompson

(57) ABSTRACT

The present invention relates to a semiconductor storage device in which data retention current consumption can be reduced. This device comprises memory cells, an internal power supply circuit for supplying an internal voltage HVC to the memory cells, transistors for halting the internal power supply circuit, and a switch circuit (transistors) for selectively supplying one of the internal voltage HVC or an externally supplied voltage HVC_EXT to the memory cells. When the memory cells are in a stand-by state (SLEEP=1) and are not engaged in a refresh operation, the internal power supply circuit is halted, and the externally supplied voltage HVC_EXT is supplied to the memory cells.

14 Claims, 12 Drawing Sheets

SEMICONDUCTOR STORAGE DEVICE AND SYSTEM USING THE SAME

BACKGROUND OF THE INVENTION

1. Field of the Invention

The present invention relates to a semiconductor storage device, such as a DRAM, and a system, such as a memory board, using the semiconductor storage devices.

2. Description of Related Art

Recently, as the degree of integration of a memory (semiconductor chip) such as a DRAM (dynamic random access memory) increases, especially in a memory system such as a memory board comprising a plurality of semiconductor chips, it has become desirable to decrease the power consumption of each memory when in a stand-by state.

In a memory, in order that the memory maintains data when in a stand-by state, at least two kinds of current are necessary. The first is the current to be supplied to a circuit for generating a half VCC (HVCC; which is a half of a source voltage and is shown as HVC in the figures), and the second is the current to be supplied to a circuit for generating a back bias voltage. The voltage HVCC is used to precharge bit lines and is supplied to counter electrodes in memory cells. On the other hand, the back bias is a voltage applied to transistor substrates included in the memory cells, and is generally about −1 volt in the case of DRAMs. Therefore, in a memory system, it is necessary to provide internal power supply circuits (voltage regulators) for generating such kinds of voltage, and to supply currents to each of the internal power supply circuits. Therefore, in order to reduce power consumption of a memory in a stand-by state, it is necessary to reduce the currents to be supplied to those internal power supply circuits.

Japanese Patent Application Laid-open No. Hei 9-063267 titled "Semiconductor Storage Device" discloses an example of a DRAM or a memory board in which power consumption can be reduced. This memory board comprises a plurality of DRAMs having no lowering voltage circuit and a buffer circuit for lowering supply voltage, and the lowered supply voltage is supplied to the external power reception pin of each DRAM. In this memory board, because the lowered supply voltage is supplied to each DRAM as a supply voltage, the power consumption of the internal power supply circuits provided in each DRAM can be reduced.

FIGS. 17 to 19 diagrammatically illustrate an embodiment disclosed in the above prior art document. As shown in FIG. 17, a memory board 100 comprises eight DRAMs 110 and a controller 120 which controls the DRAMs 110. The controller 120 receives external control signals /RAS and /CAS and supplies to the DRAMs row-address strobe signals /RASd and column-address strobe signals /CASd. As shown in FIG. 18, the controller 120 includes a buffer circuit 121, and this buffer circuit 121 lowers the supply voltage VCC to generate a lowered voltage VCL. For example, the supply voltage VCC is 5 volts and the lowered voltage VCL is 3.3 volt, and the lowered voltage VCL is supplied to the DRAMs 110 as a supply voltage.

Furthermore, in this prior art, in order to reduce the supply current when in a stand-by state, as shown in FIG. 18, the buffer circuit 121 consists of a pair of buffer amplifiers 121a and 121b and a state detecting circuit 122. The buffer amplifiers 121a and 121b receive a reference voltage VREF as an input voltage. When the DRAMs are in a stand-by state, the state detecting circuit 122 detects a stand-by state of the DRAMs 110 based on signals /RAS and /CAS, and outputs a stand-by signal ACT to a transistor 121c. The stand-by signal ACT turns off the transistor 121c, and the power supply to the buffer amplifier 121b is turned off. In this way, the controller 120 detects, based on signals /RAS and /CAS, that the DRAMs 110 are in a sleep mode, the controller 120 turns off the buffer amplifier 121b to reduce the output current of the lowered supply voltage VCL.

FIG. 19 illustrates an internal circuit of each DRAM 110 shown in FIG. 17. The DRAM 110 comprises an internal power supply circuit 110a, a plurality of one-transistor RAM cells (memory cells) 110b, and a plurality of sense refresh circuits 110c. In FIG. 19, only one of the memory cells 110b and one of the sense refresh circuits 110c are illustrated for the purpose of simplification. The internal power supply circuit 110a generates an intermediate voltage HVCC (HVC) from the voltage VCL supplied from the controller 120. The memory cell 110b consists of a n-MOS transistor M20 and a capacitor C20. The sense refresh circuits 110c consists of a sense amplifier A30, n-MOS transistors M30, M31, and M32.

In the internal power supply circuit 110a, a resistor R10, n-MOS transistor M10, p-MOS transistor M11, and a resistor R11 are connected in series between the lowered supply voltage terminal VCL and a ground GND. The internal power supply circuit 110a further comprises an n-MOS transistor M12 and a p-MOS transistor M13. The n-MOS transistor M12 comprises a drain connected to the terminal VCL, and a gate connected to the gate and drain of the n-MOS transistor M10 and to one end of the resistor R10. The p-MOS transistor M13 comprises a gate connected to the gate and drain of the p-MOS transistor M11 and to one end of the resistor R11. The sources of the n-MOS transistor M12 and the p-MOS transistor M13 are connected to each other, and their junction outputs a HVCC voltage HVC.

In the memory cell 110b, n-MOS transistor M20 has a drain connected to a bit line BL, a gate connected to a word line WL, and a source connected to one terminal of a capacitor C20. The other terminal of the capacitor C20 is connected to the voltage HVC.

In the sense refresh circuit 110c, a complimentary pair of bit lines are connected to a sense amplifier A30 as difference inputs, and gates of three n-MOS transistors M30, M31, and M32 are connected to a precharge (BPR) signal line BPR of the bit lines so that refresh control can be performed at data readout times and at predetermined refresh intervals based on the BPR signals. The drains of the n-MOS transistors M30 and M32 are respectively connected to the input terminals of the sense amplifier A30, and their sources are connected to the voltage HVC. Furthermore, the drain and source of the n-MOS transistor M31 are connected in parallel to the difference inputs.

As is described above, the DRAMs 110 comprises an internal power supply circuit 110a for generating a lowered supply voltage HVC, and the internal power supply circuit supplies pulse currents to a plurality of memory cells in the same memory when refresh operations are performed. Therefore, in order to stabilize the output voltage of the internal power supply circuit, it is desirable to reduce the impedance thereof. For this reason, in the art disclosed in FIG. 19, the drains and sources of the transistors M12 and M13 are connected in series, and the sources of the transistors M12 and M13 are connected to an output terminal. In this configuration, it is easy to reduce the output impedance of the internal power supply circuit without complicating the circuit configuration.

However, in the memory shown in FIG. 19, it is necessary to maintain the value of the through current flowing through the transistors M12 and M13 at more than a constant value in order to prevent oscillation of the circuit. Therefore, even if the supply voltage of the DRAMs is reduced, or even if a supply current lowering circuit such as shown in FIG. 18 is provided, it is difficult to sufficiently reduce the current consumption of the internal power supply circuit. This drawback may be overcome by using a more complicated current regulator circuit; however, in such a case, there will be another drawback that the scale of the current regulator becomes larger.

As described above, in the conventional semiconductor system such as a DRAM memory board, although reduction of data retention current in a stand-by state is desired, it is difficult to reduce the current consumption of the internal power supply circuits included in each DRAM.

SUMMARY OF THE INVENTION

An object of the present invention is to provide a semiconductor storage device and a system using the same in which the data retention current in a stand-by state can be reduced in comparison with the conventional art.

To accomplish this object, the semiconductor storage device of the present invention comprises: a plurality of memory cells; an internal power supply circuit that generates an internal voltage from a supply voltage supplied from outside so as to supply the internal voltage to the memory cells via an output node; an internal power supply stop circuit that halts the internal power supply circuit when the memory cells are in a data retention state and are not engaged in a refresh operation; wherein the output node is constructed so that the output node can be connected to an external power supply via an external power supply terminal.

According to the present invention, when the memory cells are in a data retention state, the internal power supply stop circuit halts the internal power supply, and the output node is connected to the external power supply to enable the data to be retained in the memory cells. Therefore, the current consumption by the internal power supply circuits can be omitted, and the data retention current of the semiconductor storage device can be reduced.

The semiconductor storage device may comprise a switch that connects and disconnects between the output node and an external power supply terminal.

Furthermore, the semiconductor storage device may comprise a control circuit that turns the switch on when the plurality of memory cells are in a stand-by state and are not engaged in a refresh operation.

The semiconductor storage system of the present invention comprises a plurality of the above semiconductor storage devices. The external power supply terminals of the semiconductor storage devices are respectively connected to each other so that the output nodes of the semiconductor storage devices can be connected to each other by switches.

In this case, when the memory cells are in a data retention state, all the internal power supply stop circuits halt the corresponding internal power supply circuits, and the output node is connected to the external power supply to enable the data to retained in the memory cells.

Otherwise, when the memory cells are in a data retention state, while one of the internal power supply circuits is activated, the other internal power supply circuits are halted by the corresponding internal power supply stop circuits, and all the memory cells in the system are supplied power from the activated internal power supply circuit. In both cases, the total current consumption of the internal power supply circuits can be reduced, and the data retention current of the semiconductor storage system can be reduced.

The system may be constructed so that one of the following two states can be selected:

(i) a first state in which one of the semiconductor storage devices is selected as a master and the others are selected as slaves, the internal power supply circuit of the master is activated, the switches are turned on to connect the output nodes to each other, and the internal power supply stop circuits of the slaves are activated to halt the internal power supply circuits of the slaves; and (ii) a second state in which the internal power supply circuits of the semiconductor storage devices are activated and the switches are turned off to disconnect the output nodes to each other.

The semiconductor storage system may comprise a power supply device that supplies, to the external power supply terminals of the semiconductor storage devices, the same voltage as that generated by the internal power supply circuits.

The semiconductor storage system may comprise an arbitrator circuit that dynamically selects the master and the slaves among the semiconductor storage devices. The arbitrator circuit controls the semiconductor storage devices so that refresh operations are performed only in the semiconductor storage devices selected as slaves. The arbitrator circuit may turn off the switches of the slaves when the slaves perform the refresh operations.

The internal voltage generated by the internal power supply circuit is different from the supply voltage (VCC) supplied to the memory cells, and the internal voltage is at least one of an intermediate voltage (HVC) between the supply voltage (VCC) and a ground voltage (GND), a minus voltage (VBB) lower than the ground voltage (GND), and a voltage (VBOOT) higher than the supply voltage (VCC).

In the case where the internal voltage generated by the internal power supply circuit is the intermediate voltage (HVC) between the supply voltage and a ground voltage, the internal voltage is applied to one end of each capacitor included in each of the memory cells.

In the case where the internal voltage generated by the internal power supply circuit is a minus voltage (VBB) lower than a ground voltage, the internal voltage is applied to a back gate terminal of each MOS transistor included in each of the memory cells.

The semiconductor storage system may comprise a memory cell displacement circuit that displaces memory cells which have poor data retention characteristics with redundant memory cells.

The semiconductor storage system may comprise a memory cell displacement circuit that displaces memory cells which have poor data retention characteristics with redundant memory cells, and the displaced circuit is integrated with the power supply device.

DETAILED DESCRIPTION OF THE INVENTION

Figure 17:
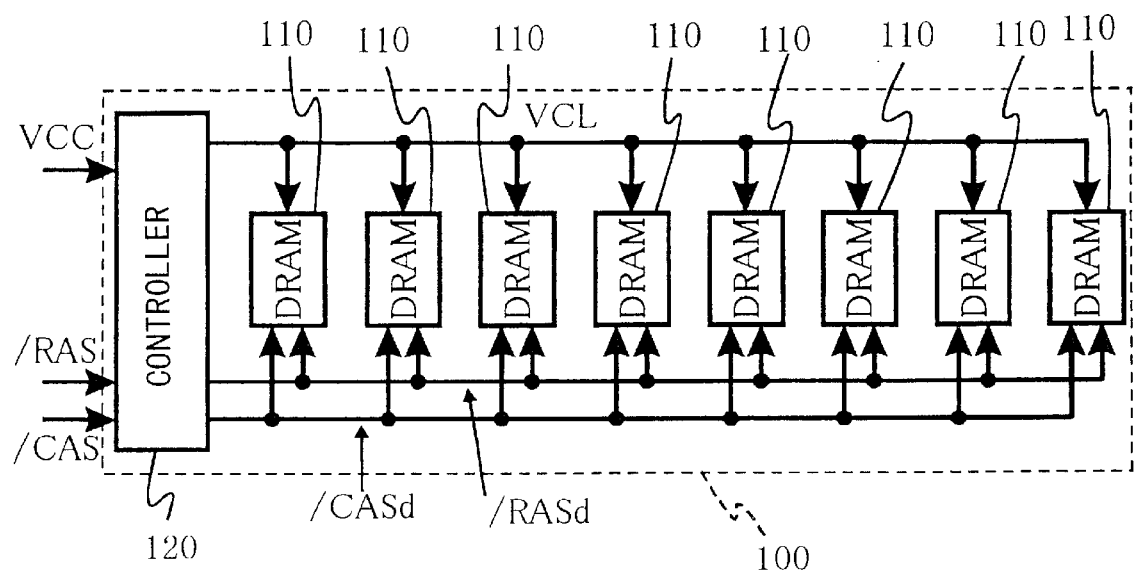
FIG. 17 is a block diagram illustrating a conventional memory board.
Figure 18:
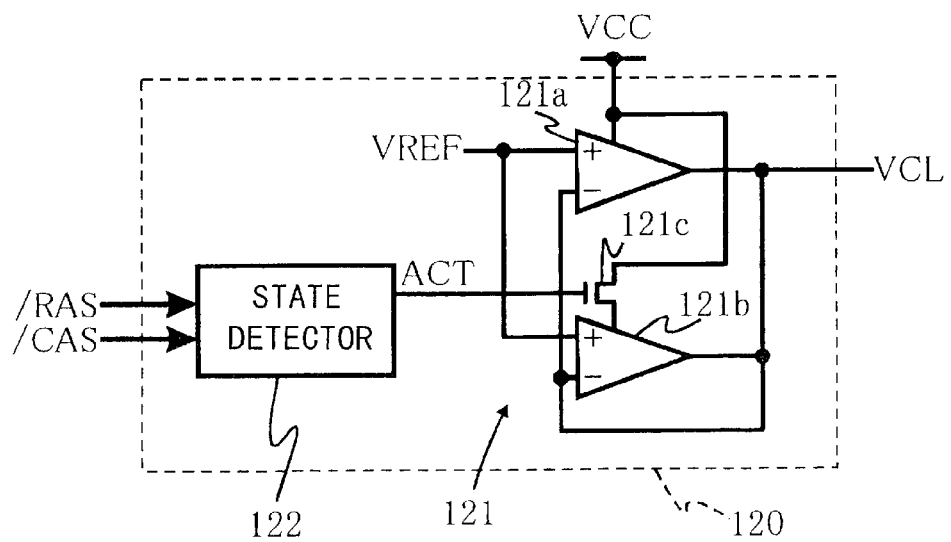
FIG. 18 is a block diagram of a controller shown in FIG. 17.
Figure 19:
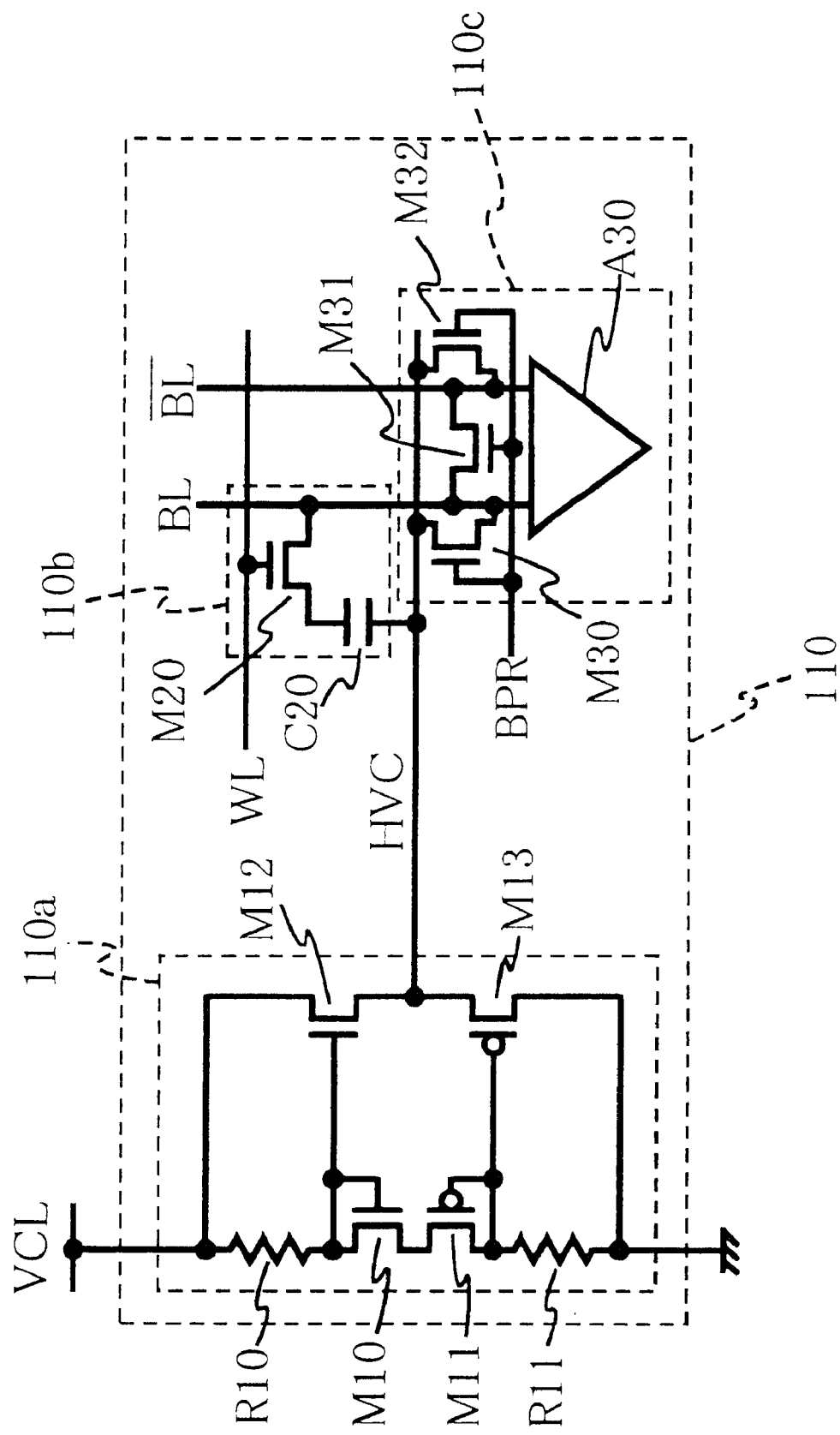
FIG. 19 is a circuit diagram of a DRAM shown in FIG. 17.

The preferred embodiments of the present invention will be explained with reference to FIGS. 1 to 16. In these FIGS. 1 to 16, elements which correspond to the elements shown in FIGS. 17 to 19 are marked with the same reference numbers or codes as those in FIGS. 17 to 19, and the explanation thereof will be omitted.

First Embodiment

Figure 1:
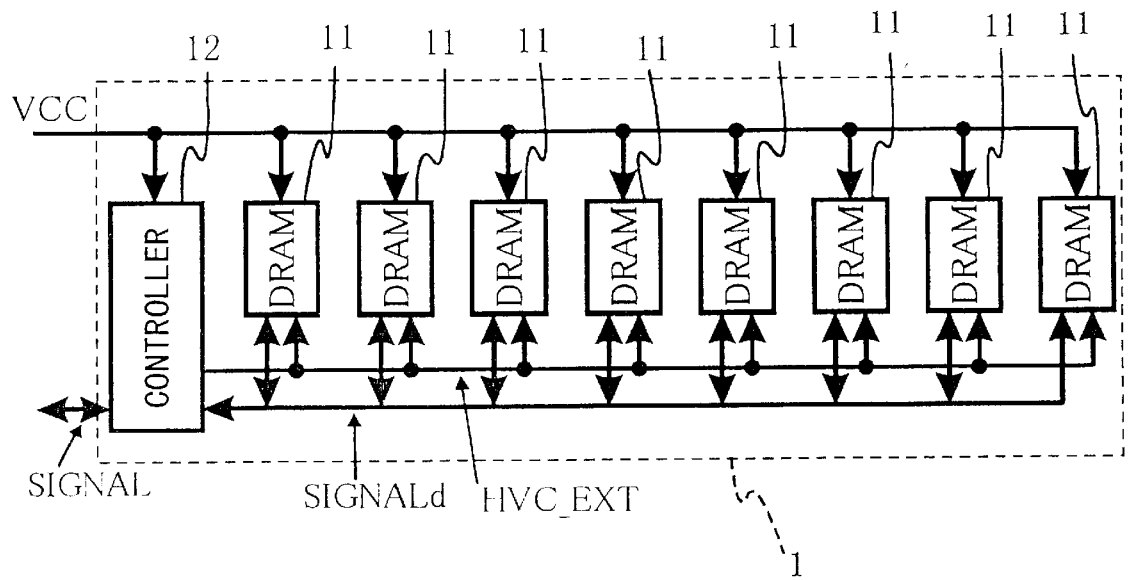
FIG. 1 is a block diagram illustrating a semiconductor storage system (memory board) according to the first embodiment of the present invention.

FIG. 1 illustrates a memory system (semiconductor storage system) according to the first embodiment of the present invention. This memory system comprises a DRAM memory board 1, and a plurality of DRAMs 11 and a controller 12 are arranged on the memory board. Although eight DRAMs 11 are used in this embodiment, the number of DRAMs is not limited to eight in the present invention. Also, the controller 12 can be omitted in the present invention as is explained later.

Each of the DRAMs 11 and the controller 12 are directly supplied with a common supply voltage VCC from a power source (not shown) provided outside the memory system. The controller 12 buffers various kinds of signals, for example, "/RAS" (Row Address Strobe), "/CAS" (Column Address Strobe), and "SIGNAL" shown in FIG. 1, and the controller 12 outputs signals "SIGNALd" so as to control the DRAMs 11. Only one signal line for the signals SIGNALd is illustrated in FIG. 1 for simplification, a plurality of signal lines are actually provided.

Figure 2:
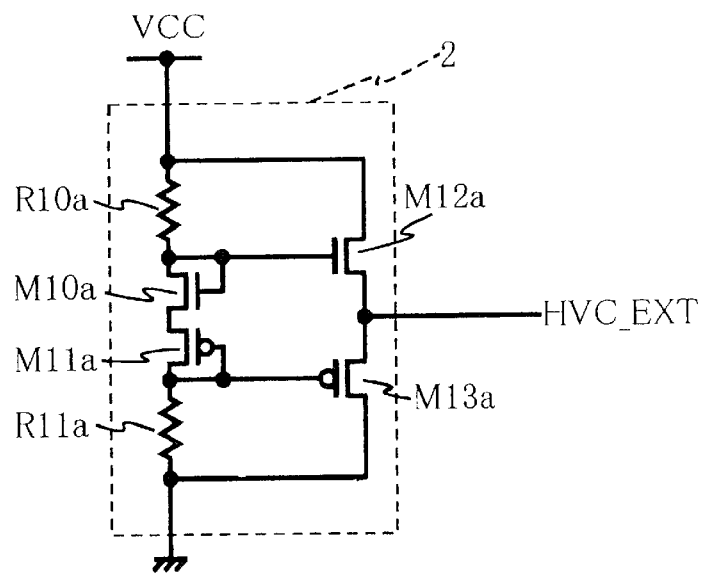
FIG. 2 is a circuit diagram of an internal power supply circuit (HVC circuit 2) included in a controller shown in FIG. 1.

As shown in FIG. 2, the controller 12 includes a HVCC generator circuit 2 (hereinafter, referred as HVC circuit 2) for generating an external voltage HVC_EXT. The external voltage HVC_EXT is the same voltage as the internal voltage HVCC to be generated by the internal power supply circuit 2a in each DRAM 11.

As shown in FIG. 2, an example of the HVC circuit 2 comprises an electrical circuit basically similar to that of the internal power supply circuit 110a shown in FIG. 19, and the elements R10a, M10a, M11a, R11a, M12a, and M13a in the HVC circuit 2 respectively correspond to the elements R10, M10, M11, R11, M12, and M13 in internal power supply circuit 110a. The HVC circuit 2 decreases the input power supply voltage VCC to generate the external voltage HVC_EXT which is about a half of the power supply voltage VCC. The code "HVC_EXT" means a HVCC voltage generated outside the DRAMs 11.

Figure 3:
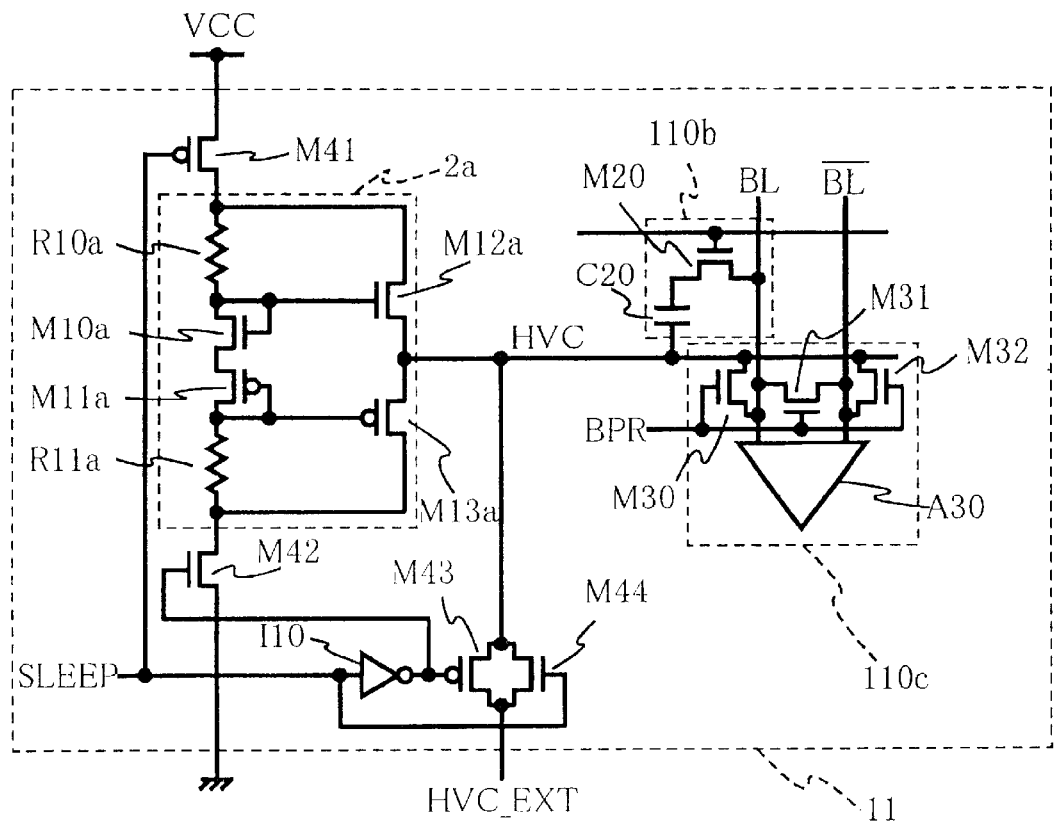
FIG. 3 is a circuit diagram of a DRAM shown in FIG. 1.

FIG. 3 is a circuit diagram of an example of the DRAM 11. As the features different from those of the conventional DRAM 110 shown in FIG. 19, the DRAM 11 comprises a p-MOS transistor M41 and an n-MOS transistor M42 for switching off the VCC current for an internal power supply circuit 2a, and a p-MOS transistor M43 and an n-MOS transistor M44 for connecting a HVC voltage line of the memory cells 110b via an external power supply terminal to the external voltage HVC_EXT when the p-MOS transistor M41 and the n-MOS transistor M42 switch off the internal power supply circuit 2a. The p-MOS transistor M41 and the n-MOS transistor M42 are respectively incorporated in the VCC side and ground side of the internal power supply circuit 2a to form an internal power supply stop circuit. The p-MOS transistor M43 and the n-MOS transistor M44 are incorporated between the HVC line and the external voltage HVC_EXT output from the HVC circuit 2 in the controller 12.

When the DRAM 11 enters a stand-by state and a sleep signal SLEEP is generated in the DRAM 11, the p-MOS transistor M41 directly receives the sleep signal SLEEP to become an off-state, the n-MOS transistor M42 receives an inverted sleep signal via an inverter 110 to become an off-state, and the internal power supply circuit 2a is switched off. Simultaneously, the p-MOS transistor M43 receives the inverted sleep signal via the inverter 110 to become an on-state, the n-MOS transistor M44 directly receives the sleep signal SLEEP to become an on-state, and the HVC line is connected to the external voltage HVC_EXT output from the HVC circuit 2. Each DRAM 11 generates the sleep signal SLEEP based on the signal SIGNALd transmitted from the controller 12, and, in this embodiment, the eight DRAMs 11 generate the sleep signal at a common timing.

According to the DRAM 11 of the present embodiment, when the sleep signal SLEEP becomes a high level, the transistors M41 and M42 switch off the internal power supply circuit 2a, and the transistors M43 and M44 connect HVC line with the external voltage HVC_EXT output from the HVC circuit 2, so that the memory cells 110b and the sense refresh circuits 110c are supplied with the external voltage HVC_EXT. In contrast, when the sleep signal SLEEP is a low level, the transistors M41 and M42 switch on the internal power supply circuit 2a, and the transistors M43 and M44 disconnect HVC line from the external voltage HVC_EXT output from the HVC circuit 2 so that the memory cells 110b and the sense refresh circuits 110c are supplied from the internal power supply circuit 2a.

As shown in FIG. 3, the internal power supply circuit 2a has the same basic structure as that of the HVC circuit 2 in the controller 12, and elements in the internal power supply circuit 2a are marked with the same reference codes as those in the HVC circuit 2. Also, the memory cells 110b and the sense refresh circuits 110c are the same as those in FIG. 19, and elements in the memory cells 110b and the sense refresh circuits 110c are marked with the same reference codes as those in FIG. 19.

According to this embodiment, when the DRAMs 11 enters a stand-by state (data retention state) so as to simply retain data while performing refresh operations at interval without being accessed from outside, the internal power supply circuit 2a is switched off, and the HVC voltage is supplied by the external voltage HVC_EXT output from the HVC circuit 2 in the controller 12. That is, the HVC circuit 2 is used to retain data in the DRAMs 11 instead of the internal power supply circuit 2a.

It is sufficient for the HVC circuit 2 to have a capability for retaining data in the eight DRAMs 11. Although each of the internal power supply circuits 2a in the DRAMs 11 consumes a constant through current for generating the HVC voltage when activated, in the present embodiment, it is possible to cut the through currents in the DRAMs 11 and to restrict the number to only one through current consumed in the HVC circuit 2 in the controller 12. Therefore, the total through current consumed in this memory system can be reduced to one eighth of that of the conventional memory system.

The reason for using the internal power supply circuits 2a when the DRAMs 11 are activated is to stabilize the action of the DRAMs 11. If the external voltage HVC_EXT generated in the controller 12 is supplied to the DRAMs 11 when in an activated state, the risk arises that external noise will enter the external voltage HVC_EXT and the data-reading characteristics may deteriorate due to the voltage fluctuation of the external voltage HVC_EXT. In the present embodiment, when the DRAMs 11 are activated, because the external voltage HVC_EXT is disconnected from memory cells 110b by a switch circuit (the transistors M43 and M44) and only the internal power supply circuit 2a is used, such deterioration of the data-reading characteristics due to the voltage fluctuation can be effectively prevented.

As described above, in the present embodiment, it is possible to reduce the total through current in a stand-by state to one eighth of that of the conventional memory system. The current which can be reduced is only the total through current consumed by HVCC circuits for generating HVCC voltage. The current consumed by the memory cells 110b themselves when in a stand-by state cannot be reduced in the present embodiment. However, because the current consumption by the memory cells 110b is much smaller than the current consumption by the HVCC circuits, the present embodiment offers sufficient effects in reducing the total current consumption of the memory system when in a stand-by state.

Modification of First Embodiment

Figure 4:
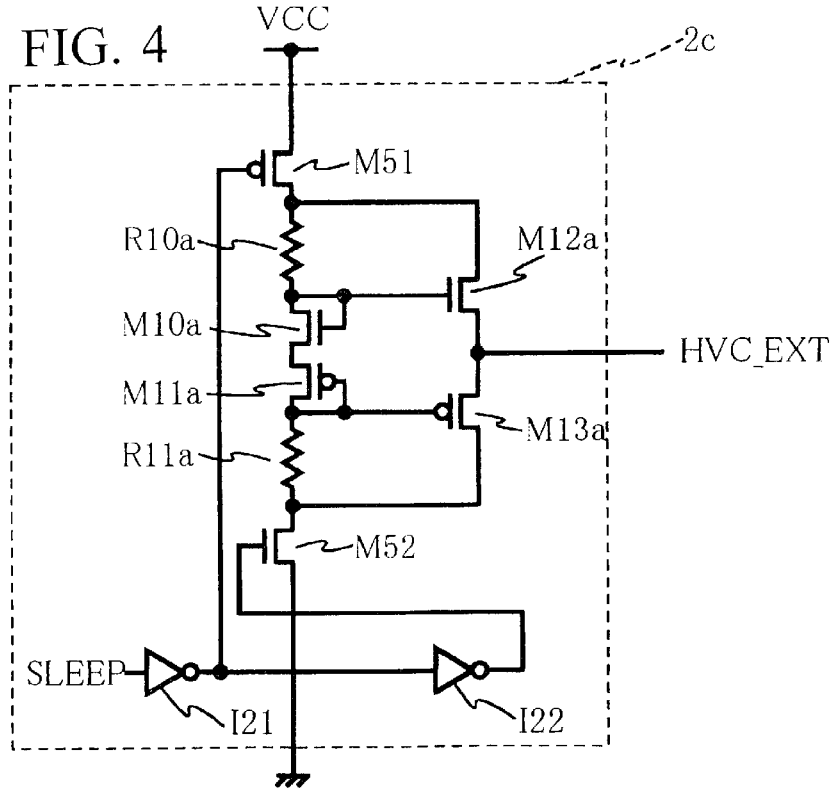
FIG. 4 is a circuit diagram of a modification of the internal power supply circuit shown in FIG. 2.

FIG. 4 illustrates a modification of the first embodiment in which the HVC circuit 2 in the controller 12 is substituted by a modified HVC circuit 2c. This HVC circuit 2c further comprises a p-MOS transistor M51 and an n-MOS transistor M52 for stopping the production of the external voltage HVC_EXT when the DRAMs 11 are in an activated state. The p-MOS transistor M51 and the n-MOS transistor M52 are respectively incorporated in the VCC side and the ground side of a HVC circuit.

When the DRAMs 11 enter an activated state from a stand-by state, a sleep signal SLEEP is generated in the controller 12. The controller 12 generates the sleep signal SLEEP as a high level signal when the controller 12 detects a stand-by state (sleep mode) of the DRAMs 11 based on at least one signal contained in signals SIGNAL input to the controller 12.

The sleep signal SLEEP is inverted by an inverter I21, and the transistor M51 receives the inverted signal to become an off state. The inverted signal is further inverted by an inverter I22, and the transistor M52 receives the two times inverted signal to become an off state. Thus, the HVC circuit is switched off when the DRAMs 11 are in an activated state, and is switched on when the DRAMs 11 are in a stand-by state.

According to this modified embodiment, when the DRAMs 11 are in an activated state, it is possible to switch off the HVC circuit in the controller 12 and to stop generating the external voltage HVC_EXT. Therefore, in comparison with the first embodiment, the current consumption of the controller 12 can be reduced during an activated state of the DRAMs 11. In contrast, when the DRAMs 11 are in a stand-by state, the transistors M51 and M52 become an on state, and the HVC circuit supplies the external voltage HVC_EXT to the DRAMs 11.

Second Embodiment

Figure 5:
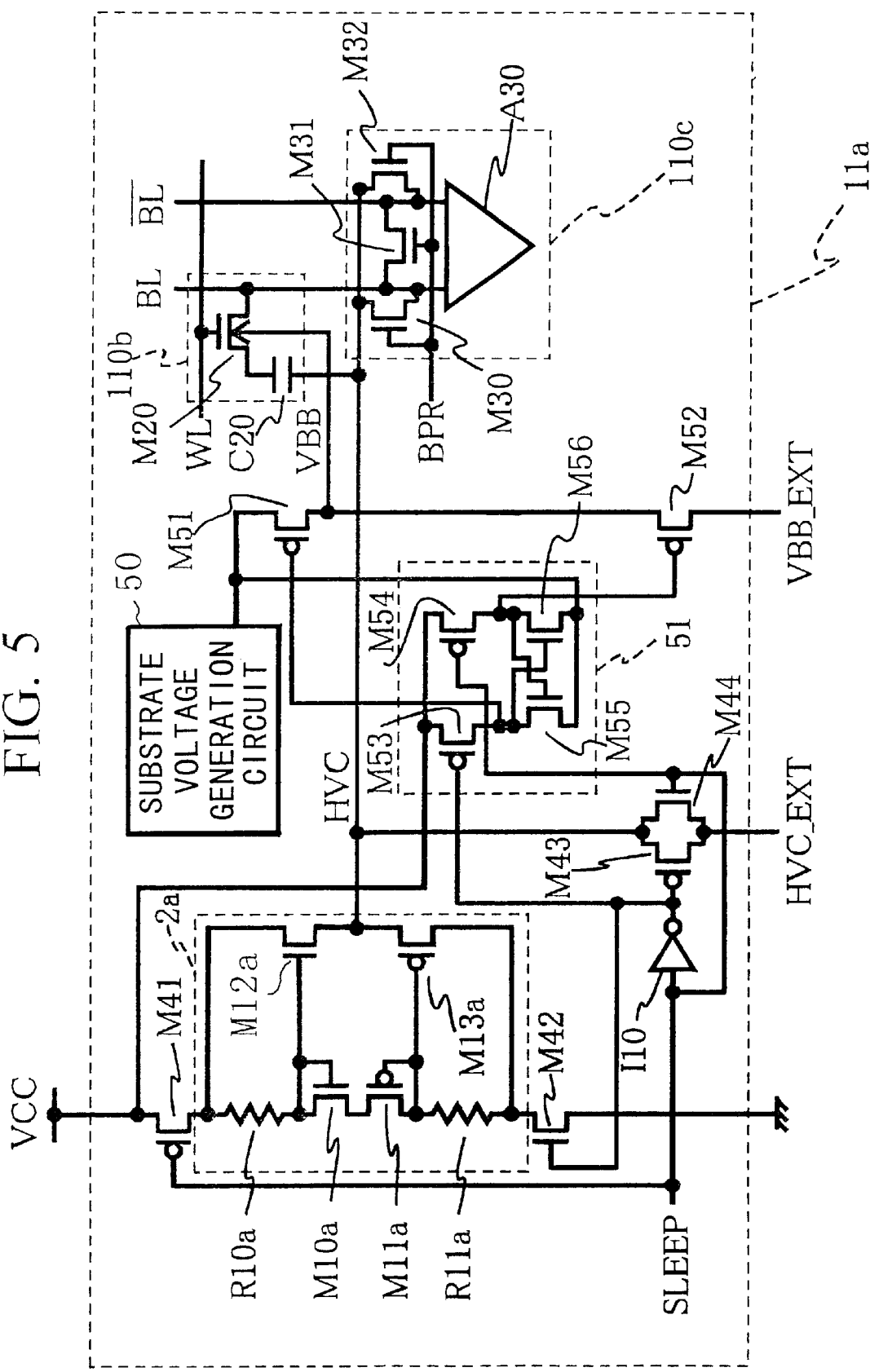
FIG. 5 is a block diagram illustrating a semiconductor storage system according to a second embodiment of the present invention.

FIG. 5 is a circuit diagram illustrating a DRAM 11a according to the second embodiment of the present invention. Elements which correspond to the elements shown in FIG. 3 are marked with the same reference codes as those in FIG. 3 and the explanation thereof will be omitted.

In comparison with the DRAM 11 shown in FIG. 3, this DRAM 11a additionally comprises a mechanism for controlling the substrate voltage VBB of the cell transistors M20 in the same manner as the control of the HVCC voltage. Because the substrate voltage VBB is a minus voltage, in order to perform switching thereof, it is necessary to provide a circuit for converting the voltage level in the present embodiment. As such a conversion circuit, the present embodiment comprises a level conversion circuit 51 consisting of p-MOS transistors M53 and M54, and n-MOS transistors M55 and M56. The level conversion circuit 51 receives the sleep signal SLEEP and converts it into a voltage suitable for performing the switching operation of the VBB voltage.

This embodiment further comprises a substrate voltage generation circuit 50 for generating the VBB voltage, and a pair of p-MOS transistors M51 and M52 as a switching mechanism. The transistors M51 and M52 receives the signals converted by the level conversion circuit 51, and selectively connects one of the output of the substrate voltage generation circuit 50 or an external substrate voltage VBB_EXT to a back gate of the transistor M20 in each memory cell 110b. The external substrate voltage VBB_EXT is supplied from a controller (12) via an external VBB voltage supply terminal (not shown) provided on each DRAM 11a. The level conversion circuit 51 is not essential in the present invention, and it can be substituted by another conventional means such as an additional circuit provided outside the DRAM 11a.

The DRAMs 11a can be used as well as the DRAMs 11 in the memory board 1 illustrated in FIG. 1. In this case, it is necessary to provide, in the controller 12, a circuit for generating the external substrate voltage VBB_EXT to be supplied to the external VBB voltage supply terminal.

In the level conversion circuit 51, the sources of the p-MOS transistors M53 and M54 are connected to the power supply voltage VCC, and the drains of the p-MOS transistors M53 and M54 are respectively connected to the drain of the n-MOS transistor M55 and the gate of the n-MOS transistor M55. The sources of the n-MOS transistor M55 and M56 are connected to the substrate voltage VBB output from the substrate voltage generation circuit 50.

The source of the p-MOS transistor M51 is connected to the substrate voltage output from the substrate voltage generation circuit 50, and drain thereof is connected to the back gate of the transistor M20 in the memory cell 110b and the drain of the p-MOS transistor M52. The source of the p-MOS transistor M52 is connected to the external substrate voltage VBB_EXT via the external VBB voltage supply terminal.

When the sleep signal SLEEP is at a low level, the inverter I10 inverts the sleep signal SLEEP and transmits it to the gate of the p-MOS transistor M53, and the signal output from the drain of the p-MOS transistor M56 is transmitted to the gate of the p-MOS transistor M51 to turn on the transistor M51. Thus, the substrate voltage output from the substrate voltage generation circuit 50 is transmitted to the back gate of the transistor M20 in the memory cell 110b to activate the transistor M20. Simultaneously, when the sleep signal SLEEP is at a low level, the sleep signal is input into the gate of the p-MOS transistor M54, and the output from the drain of the transistor M54 is input into the gate of the p-MOS transistor M52 to turn off the transistor M52. Thus, the external substrate voltage VBB_EXT is disconnected from the back gate of the transistor M20.

In contrast, when the sleep signal SLEEP is at a high level, the transistor M51 is turned off so as to disconnect the output of the substrate voltage generation circuit 50 from the back gate of the transistor M20, and the transistor M52 is turned on so as to connect the external substrate voltage VBB_EXT to the back gate of the transistor M20.

Figure 6:
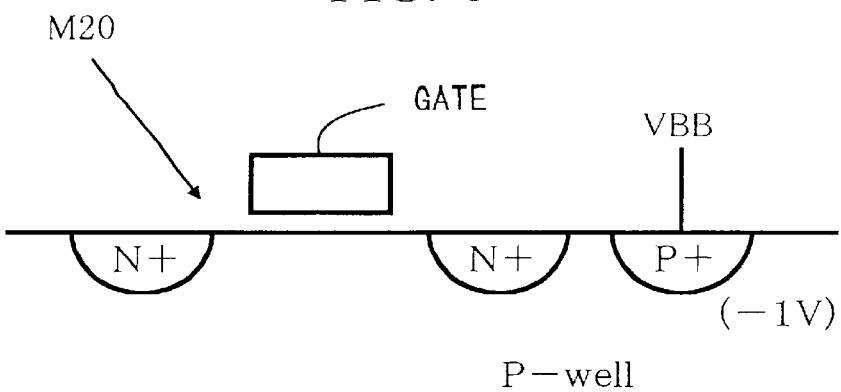
FIG. 6 is a cross section of an n-MOS transistor in a memory cell of the DRAM shown in FIG. 3.

The substrate voltage generation circuit 50 generates the substrate voltage VBB for the MOS transistor M20 of the memory cells 110b in the DRAM 11a. As shown in FIG. 6, each memory chip has N-type diffusion layers and P-type well, and the substrate of the memory chip is preferably applied with about −1 volt (=substrate voltage VBB). Because the threshold voltage (VT) of the transistor has a back-bias dependency, if such a minus substrate voltage is not applied to the substrate, the transistor should work in a state where the back-bias dependency is sharp, and there is a risk that data leak due to noise may occur. For this reason, a substrate voltage of about −1 volt is applied to the substrates of the memory chip in the DRAM.

Because the substrate voltage should be applied even when the DRAMs arc in a stand-by state, the data retention current of the conventional DRAM in a stand-by state increases in order to generate the substrate voltage. In the present embodiment, a switch circuit consisting of the transistors M51 and M52 is provided for making it possible to halt the substrate voltage generation circuit 50 when in a stand-by state and for connecting the external substrate voltage VBB_EXT to the substrate of the memory chip. Therefore, the data retention current of this DRAM in a stand-by state can be reduced in a manner similar to that of the first embodiment.

Figure 7:
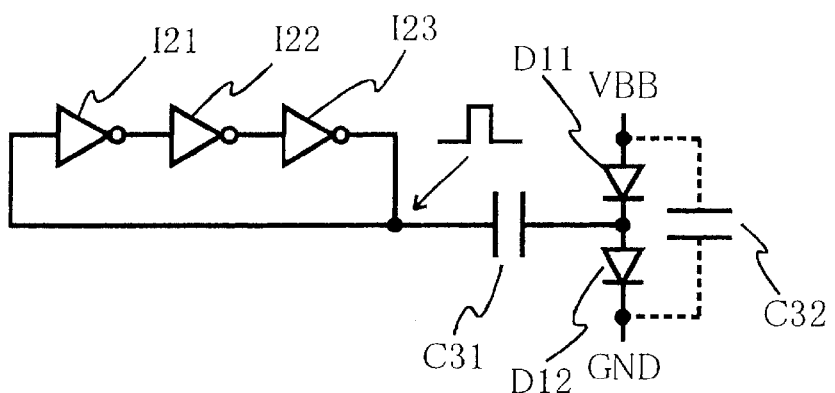
FIG. 7 is a circuit diagram of a substrate voltage (VBB) generation circuit shown in FIG. 5.

FIG. 7 illustrates a charge pump circuit as an example of the substrate voltage generation circuit 50. This charge pump circuit comprises a ring oscillator consisting of an odd number (in this example, three) of inverters I21, I22, and I23, and the ring oscillator repeatedly outputs pulses to a capacitor C31. The electric charge in the capacitor C31 is drawn out by a pair of diodes D11 and D12 and a substrate capacity C32, and negative substrate voltage VBB is generated. By supplying the substrate voltage VBB from outside the DRAM 11a, it is possible to halt the ring oscillator and to omit the current consumption of the ring oscillator. FIG. 5 does not show the halting mechanism for switch off the ring oscillator; however, such a halting mechanism can be easily actualized by providing a mechanism which halts the inverters I21, I22, and I23 in accordance with the sleep signal SLEEP when the external substrate voltage VBB EXT is connected to the substrate.

Third Embodiment

Figure 8:
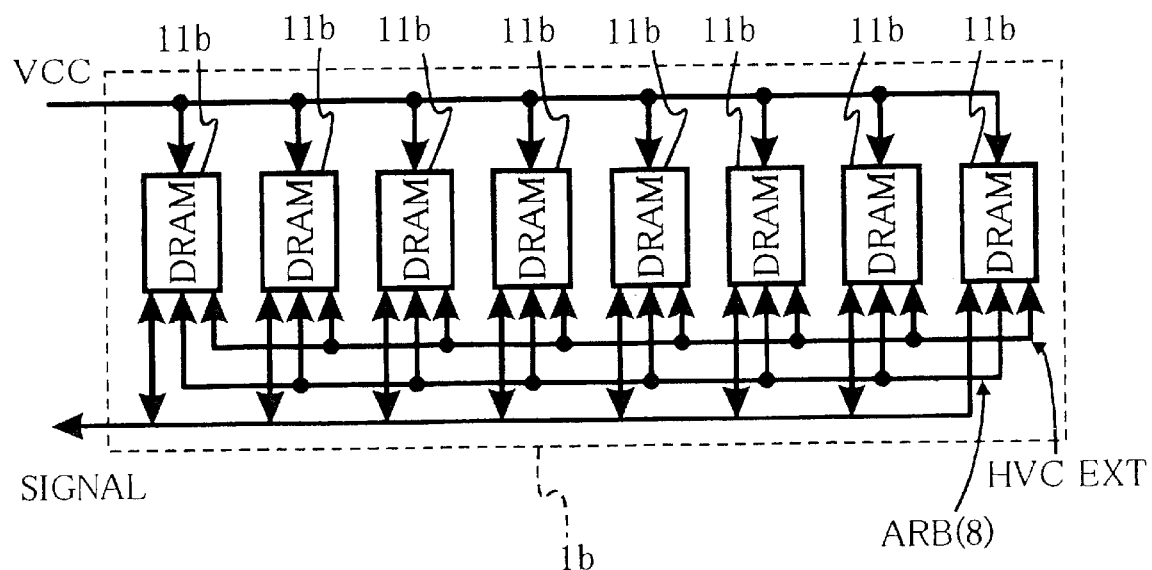
FIG. 8 is a block diagram illustrating a semiconductor storage system according to a third embodiment of the present invention.

FIG. 8 illustrates a memory board 1b according to the third embodiment of the present invention in which a controller is not provided. In this memory board 1b, eight DRAMs 11b are connected to each other by eight signal lines for transmitting eight arbitration signals ARB(8). Furthermore, the eight DRAMs 11b are connected to each other by a power supply line for transmitting an external voltage HVC_EXT from one of the eight DRAMs 11b to the other DRAMs 11b. In this case, the external voltage HVC_EXT is generated by the internal power supply circuit (see 2a in FIG. 2) of one of the eight DRAMs 11b, and the external voltage HVC_EXT is supplied to the memory cells in the other DRAMs 11b. The code "ARB" means "Arbitration", and the arbitration signals ARB are transmitted between the eight DRAMs 11b in order to determine and activate only one of the internal power supply circuits in the eight DRAMs 11b. Furthermore, the arbitration signals ARB are used for the arbitration to prevent a plurality of the DRAMs 11b from being simultaneously engaged in a refresh operation.

Figure 9:
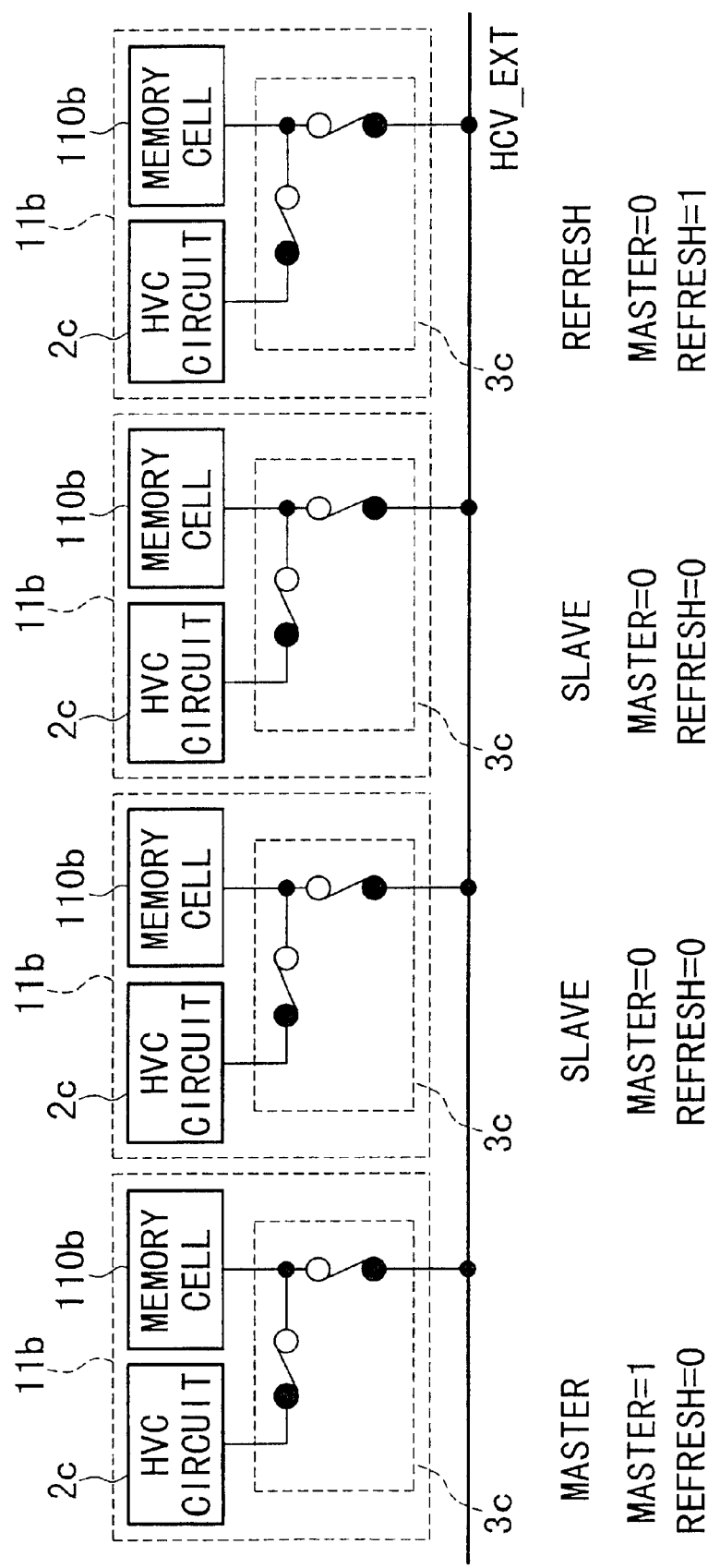
FIG. 9 is a block diagram for explaining the operation of the third embodiment of the present invention.

FIG. 9 illustrates an example of such arbitration. In FIG. 9, one of the eight DRAMs 11b (chip) is selected as a master, the others are slaves, and the internal HVC circuit 2c (see FIG. 4) in the master DRAM 11b is activated. The master DRAM 1b keeps outputting the arbitration signal ARB at a high level. In the case where the master DRAM 11b should become a slave, the master DRAM 11b changes the arbitration signal ARB to a low level, and informs the other DRAMs 11b that the master DRAM 11b will be a slave. When another DRAM 11b receives the requirement from the master DRAM 11b, in the case where the receiving DRAM 11b is able to transfer to a master state, the receiving DRAM 11b outputs an arbitration signal ARB of a high level and transfers to a master state. The DRAM 11b to be a slave detects this arbitration signal ARB, and it transfers to a slave state from a master state.

In FIG. 9, only four DRAMs 11b are illustrated for simplification whereas eight DRAMs 11b are used in the present embodiment as shown in FIG. 8. Each DRAM 11b comprises a HVC circuit 2c similar to that shown in FIG. 4, a plurality of memory cells 110b (only one is shown), and a switch circuit 3c for selectively connecting one of external voltage HVC_EXT and the output of the HVC circuit 2c to a HVCC input of the memory cell 110b. The switch circuit 3c consists of a pair of switch elements, and the switch circuit 3c is controlled by a logic circuit (not shown) provided in the DRAM 11b, in accordance with the signals SIGNAL and the eight arbitration signals ARB, so as to turn on one of the two switch elements. Furthermore, this embodiment comprises the same mechanisms as those of the first embodiment, however, those are not shown in FIG. 9 for simplification.

In the present embodiment, when all the DRAMs 11b are in a stand-by state, one of the DRAMs 11b becomes a master (MASTER=1 in FIG. 9), and the HVC circuit 2c in the master supplies current not only to the memory cell 110b of itself but also to the memory cell 110b of the remaining seven slaves (MASTER=0 in FIG. 9). The eight DRAMs 11b communicate to each other using the arbitration signals ARB, and are controlled so that only one master is selected from among them.

In each of the slave DRAMs 11b, the switch circuit 3c disconnects the HVC circuit 2c from the memory cell 110b, and the memory cell 110b is supplied with the external voltage HVC_EXT from the HVC circuit 2c in the master DRAM 11b. However, when the slave DRAM 11b performs a refresh operation, the switch circuit 3c disconnects the external voltage HVC_EXT from the memory cell 110b, and the memory cell 110b is supplied with the HVCC voltage from the HVC circuit 2c of itself. The timing of the refresh operations is determined by a controller circuit (not shown) according to the conventional art. In this case, as shown in FIG. 9, when a control flag REFRESH in each DRAM 11b is high (REFRESH=1), the refresh operation is performed in this DRAM 11b.

Although the number of lines for transmitting the arbitration signals ARB is eight in the present embodiment, it is not necessary to provide the same number of ARB lines as the number of the DRAMs fixed on the memory board. In order to enable the arbitration of the DRAMs 11b, the number of the ARB lines should be two or more. However, in the case where eight ARB lines are provided, the circuit is the simplest. In this case, each DRAM 11b has a corresponding ARB line, and each DRAM 11b can output a signal "0" or "1" to the corresponding ARB line as its own flag. The master DRAM 11b outputs a signal "1", and the slave DRAMs 11b output signals "0". When one of the DRAMs 11b is outputting a signal "1" as the master, the others become slaves.

When a plurality of the DRAMs 11b simultaneously output signals "1", one of them is selected as a master in accordance with a predetermined priority. Such a priority may be, for example, a priority in which the leftmost (or the rightmost) DRAM on the memory board is preceded. When all the arbitration signals ARB are "0", except for a DRAM performing a refresh operation, one of them is selected as a master in accordance with a predetermined priority. Such a priority may be, for example, a priority in which the leftmost (or the rightmost) DRAM on the memory board becomes a master. The method of arbitration using the arbitration signals ARB can be variously modified as is well known in the conventional art.

In a similar way to the first embodiment, this embodiment can reduce the stand-by current to about one eighth. Although one of the DRAMs 11b is performing a refresh operation in FIG. 9, the refresh operations are very rare in a stand-by state, and the effects of the present invention is not influenced by the refresh operations. When it becomes necessary to perform a refresh operation in the master DRAM 11b, the master DRAM 11b changes the arbitration signals ARB to "0", and, after one of the slave DRAMs 11b becomes the new master in accordance with a priority, then, the DRAM 11b which was previously a master performs a refresh operation. In this way, it is only possible for the refresh operation to be performed in slave DRAMs 11b.

Figure 10:
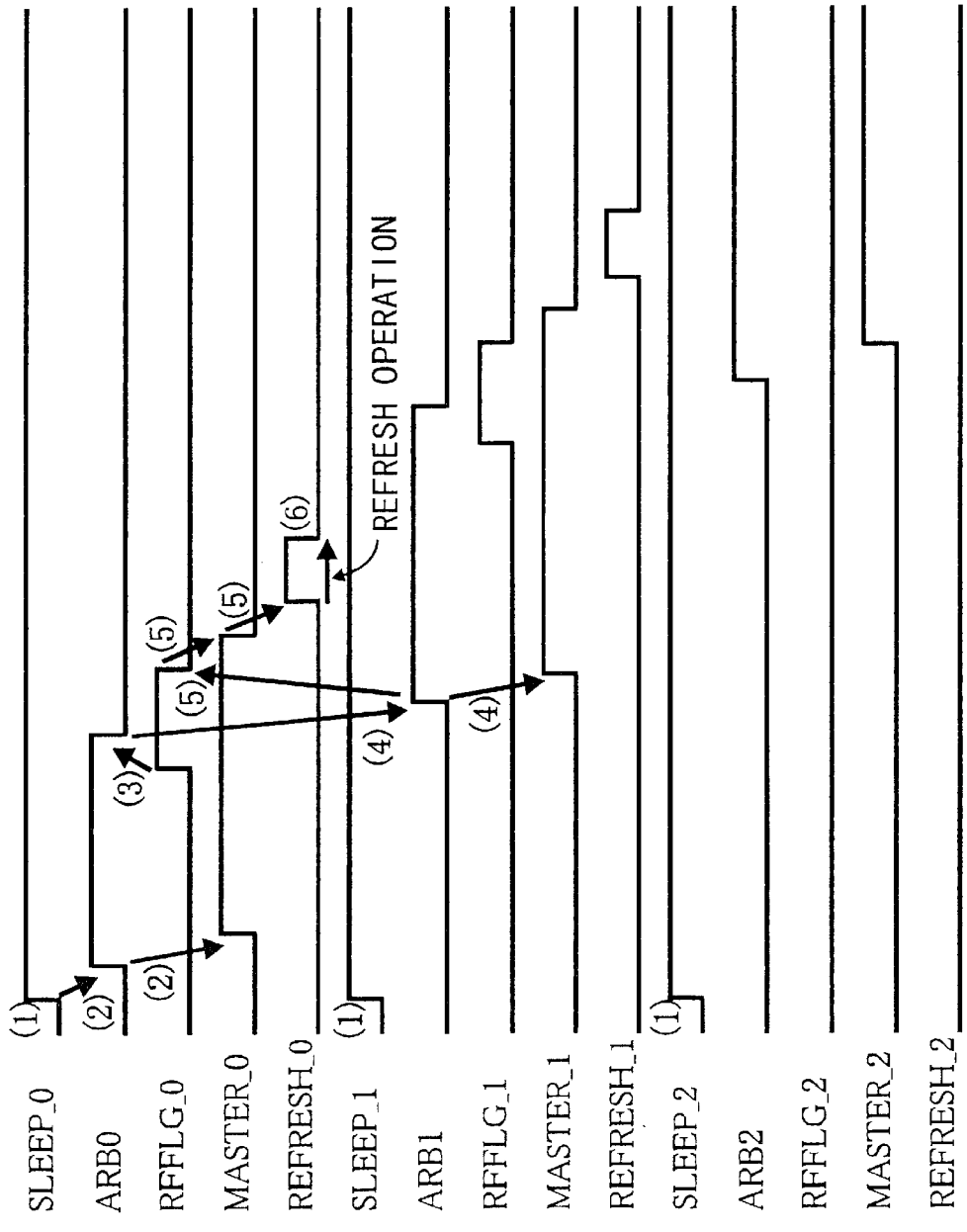
FIGS. 10 and 11 are timing charts for explaining the operation of the third embodiment shown in FIG. 9.

FIG. 10 is a time chart showing changes of signals transmitted between the DRAMs 11b. Signals "SLEEP", "RFFLG", "MASTER", and "REFRESH" are internal signals in DRAM 11b. Additional codes "_0", "_1", and "_2" respectively indicate that ths signals are signals of DRAMs of No. 0, No. 1, and No. 2. Signals "ARB0", "ARB1" and "ARB2" are the ARB signals input from outside. Signals "RFFLG" are flags indicating the necessity of a refresh operation. The operation will be performed as follows:

(1) In response to the external signals, the DRAMs 11b enter into a stand-by state (data retention mode), and signal SLEEP of it rises.

(2) DRAM of No. 0 is selected as a master in accordance with a priority, and the signal ARB0 and the signal MASTER_0 rise.

(3) If the signal RFFLG_0 rises while the DRAM No. 0 is a master, the DRAM No. 0 drops the signal ARB0 and requires the DRAM No. 1 to be the next master. The signal RFFLG_0 rises at a constant interval according to refresh control.

(4) The DRAM No. 1 confirms that no refresh operation is being performed therein, and raises ARB1 to inform the other DRAMs that it has inherited master status, then, the DRAM No. 1 raises MASTER_1.

(5) When the DRAM No. 0 confirms the rise of the signal ARB1, the DRAM No. 0 further confirms the rise of the signal RFFLG_0, and drops the signal MASTER_0. Then, the DRAM No. 0 performs a refresh operation.

(6) After the refresh operation is completed, the DRAM No. 0 drops the signal REFRESH_0. The refresh signals are applied in turns to one of the DRAMs No. 0 to No. 7, and the turn returns to the DRAM No. 0 after the DRAM No. 7.

Figure 11:
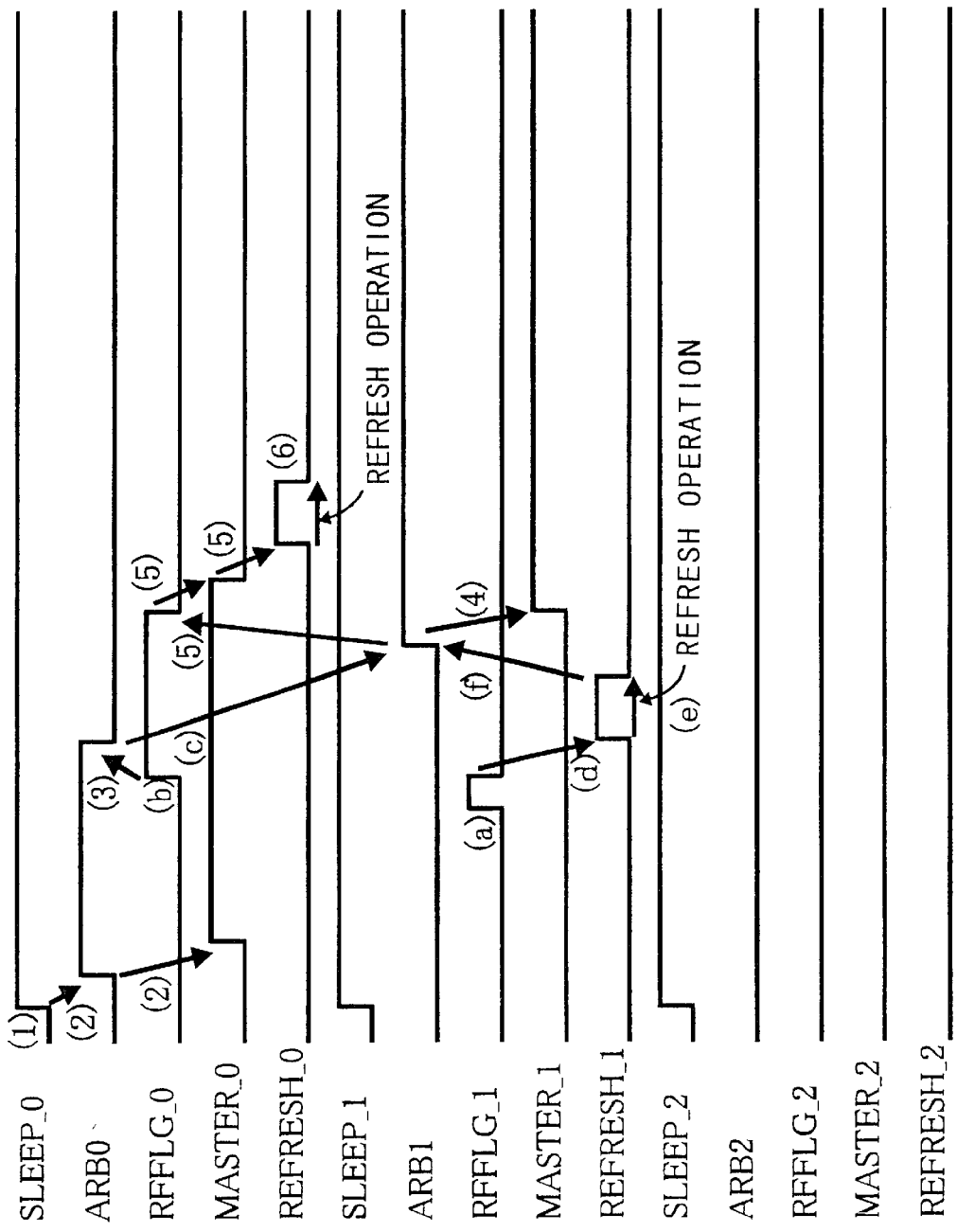

FIG. 11 illustrates an example of a time chart in the case where the DRAM No. 1 is engaged in the refresh operation and the DRAM No. 0 requires the DRAM No. 1 to be a master. In the case where the signals RFFLG_1 and RFFLG_0 rise almost simultaneously (see (a) and (b)), the slave DRAM No. 1 raises the signal REFRESH_1 (see (d)) and then performs the refresh operation (see (e)). While the DRAM No. 1 performs the refresh operation (e), if the master DRAM No. 0 drops the signal ARB0 and requires the DRAM No. 1 to be the next master (c), the DRAM No. 1 waits for the completion of the refresh operation, and, after the completion of the refresh operation, the DRAM No. 1 raises the signal ARB1 (see (f)) to inform the other DRAMs that it has inherited master status. That is, the DRAM No. 1 delays raising the signal ARB1 until the signal REFRESH_1 falls. The other steps are the same as those explained referring FIG. 10.

Other Modifications

In the above embodiments, the internal power supply circuits generate the intermediate voltage HVCC or the substrate voltage VBB. However, the present invention can also be applied to devices using another internal power supply voltage which is different from the power supply voltage VCC and the ground voltage GND.

Figure 12:
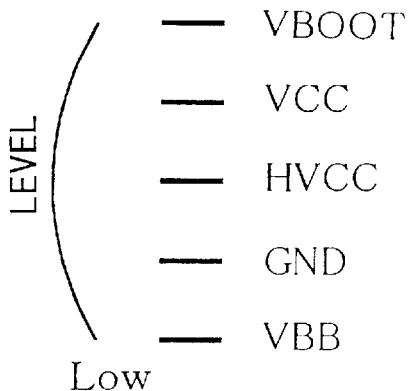
FIG. 12 is a diagram illustrating various internal power supply voltages used in a DRAM.
Figure 13:
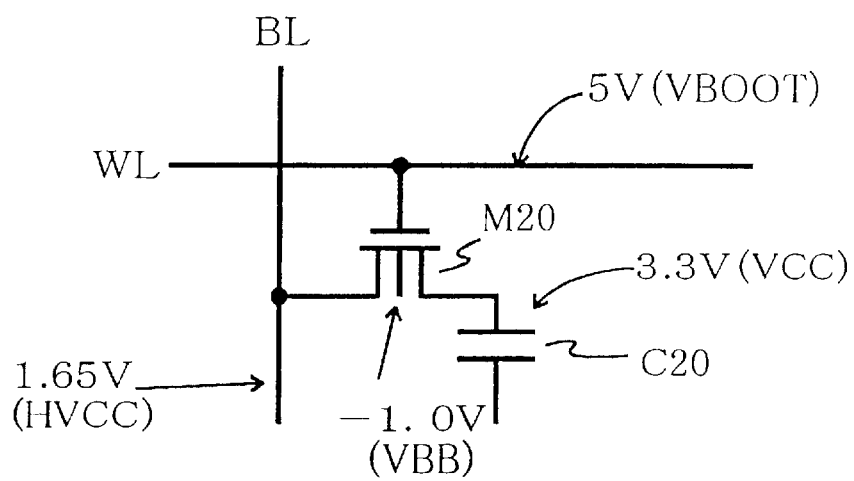
FIG. 13 is a circuit diagram of a memory cell using the internal power supply voltages shown in FIG. 12.
Figure 14:
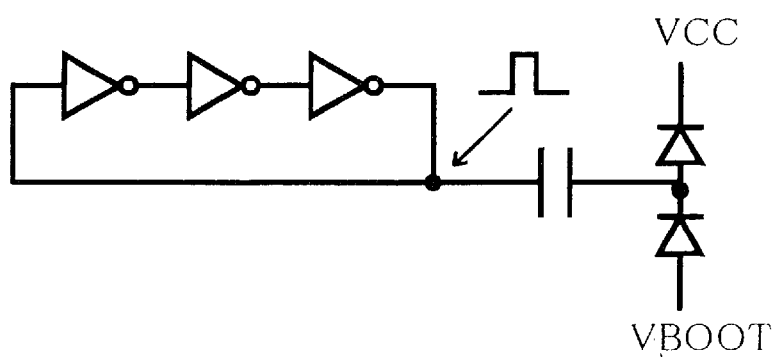
FIG. 14 is a circuit diagram of an example of a boosted voltage generation circuit for generating VBOOT shown in FIGS. 12 and 13.

For example, the present invention can be applied with regard to a boosted voltage (VBOOT) for word lines. FIG. 12 shows the various kinds of voltages used in a DRAM, and these voltages are used as shown in FIG. 13. The boosted voltage VBOOT can be generated by a charge pump circuit shown in FIG. 14 which is similar to that shown in FIG. 7. Even in this case, it is possible to halt the ring oscillator circuit when in a stand-by state for reducing the current consumption in the stand-by state.

The system formed using a plurality of the semiconductor storage devices of the present invention is not limited to a memory board consisting of a plurality of DRAMs or a memory board consisted of a plurality of DRAMs and a controller. The system of the present invention may be a system integrally incorporated into a computer, a computer peripheral unit, or electrical equipment. The system of the present invention should comprise at least two DRAMs, because in the case where only one DRAM is used, it is not possible to obtain the effect to reduce the current consumption when in a stand-by state. However, because each of the semiconductor storage devices and the controller contained in the system of the present invention have characteristics clearly different from the conventional art, each of the semiconductor storage devices and the controller can be recognized as an embodiment of the present invention.

The system of the present invention preferably comprises a memory cell displacement circuit for displacing memory cell(s) which have poor data retention characteristics, that is, in which the data retention current is large in comparison with a normal one, with at least one redundant memory cell. In this case, it is possible to use DRAMs containing such inferior memory cells as well as normal DRAMs. For example, if a DRAM is detected by product inspection to contain a small number of inferior memory cells which require frequent refresh operations for retaining data, the memory cell displacement circuit displaces the inferior cells with redundant memory cells which are previously provided in the system so that data can be retained by the usual frequency of refresh operations. Because the main object of the present invention is to reduce the current consumption of the memory cells, by providing such a memory cell displacement circuit, it is possible to emphasize the effects of the present invention.

Figure 15:
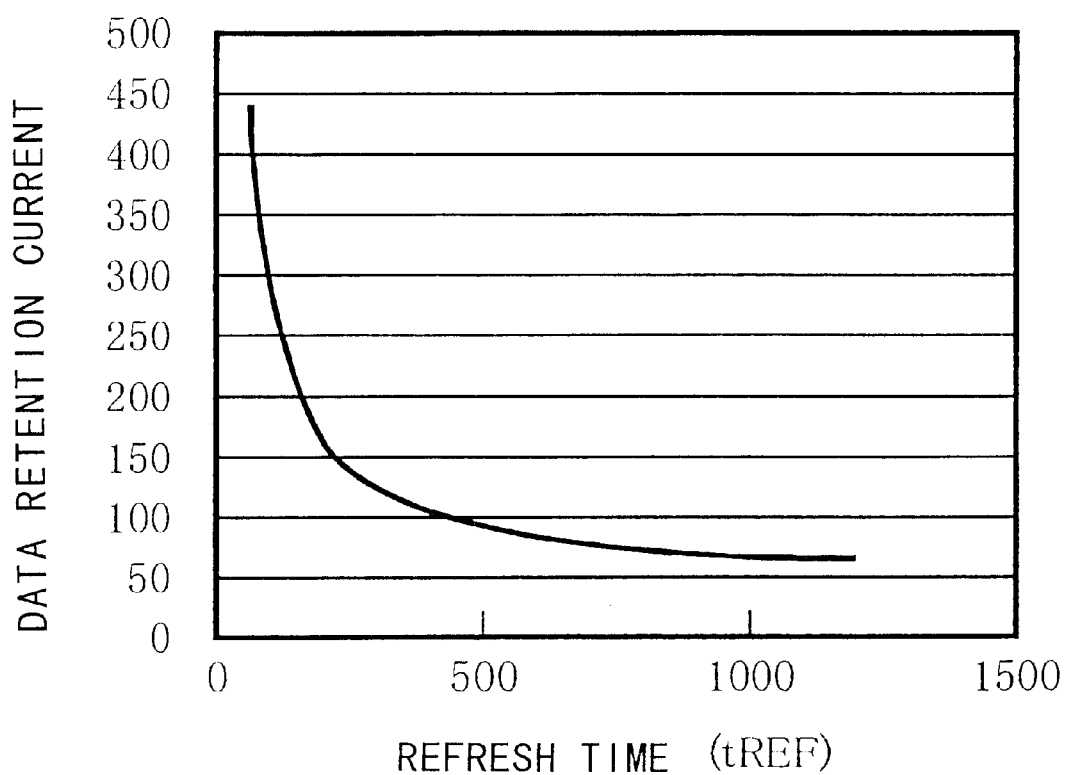
FIG. 15 is a graph for explaining the relation between a refresh time and a data retention current in a DRAM.

FIG. 15 is a graph showing the relationship between the data retention current and the refresh time in a DRAM. The axis of ordinates indicates the total current value of a refresh current for occasionally refreshing memory cells and a current continuously consumed by internal circuits such as an internal power supply circuit (HVC circuit). The axis of abscissas indicates refresh time which is an interval between the refresh operations. The values written on each axis are reference values. As shown in FIG. 15, the shorter the refresh time becomes, the greater the data retention current becomes. Therefore, by means of displacing inferior memory cells with the redundant memory cells, the refresh time can be extended, and the total data retention current can be reduced.

In the case where the memory cell displacement circuit is provided for remedying inferior memory cells and for reducing the refresh current, the ratio of the current consumed by the internal power supply circuit to the total data retention current becomes large. Therefore, the present invention is much more effective when applied to a system in which the memory cell displacement circuit is provided for reducing the refresh current. In the case where the memory cell displacement circuit is effectively incorporated into a memory system including eight DRAMs, the data retention current (saturation current) thereof can be reduced to nearly one eighth.

Fourth Embodiment

Figure 16:
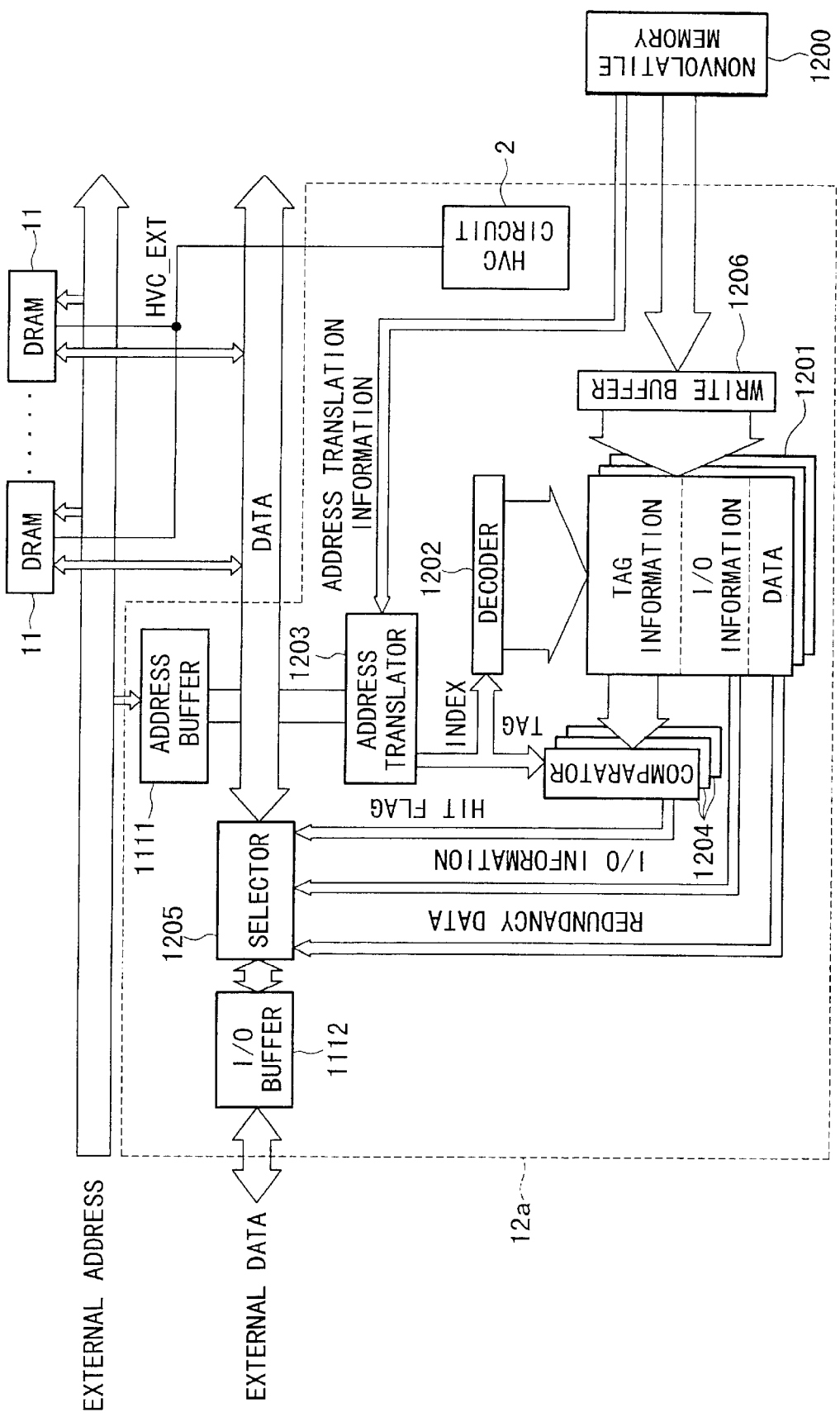
FIG. 16 is a block diagram illustrating a semiconductor storage system according to a fourth embodiment of the present invention.

FIG. 16 is a block diagram illustrating a memory system (for example, a memory board), which has a memory cell displacement function, according to the fourth embodiment of the present invention. This memory system comprises a controller 12*a*, a plurality of DRAMs 11, a non-volatile memory 1200, and peripheral circuits, and these are assembled as a memory board in this embodiment. In the non-volatile memory 1200, address information of inferior memory cells having poor data retention characteristics in the DRAMs 11 is stored in advance.

The controller 12*a* comprises a HVC circuit 2, an address buffer 1111, an I/O buffer 1112, a memory cell array 1201, a decoder 1202, an address translator 1203, a comparator 1204, a selector 1205, and a write buffer 1206. The HVC circuit 2 may be the same as that in FIG. 2, and generates an external voltage HVC_EXT.

The address buffer 1111 is provided between an external address bus and the address translator 1203. The I/O buffer 1112 is provided between the external address bus and the selector 1205. The memory cell array 1201 contains a plurality of pairs of spare memory cell arrays. The decoder 1202 receives index addresses output by the address translator 1203 and outputs word line signals to the memory cell array 1201. The address translator 1203 receives address translation information from the non-volatile memory 1200, and based on this address translation information, translates address data transmitted from the non-volatile memory 1200 to index addresses or tag addresses. The comparator 1204 compares the tag information registered in the memory cell array 1201 and the tag addresses output from the address translator 1203.

The selector 1205 is provided between a data bus connected to the DRAMs 11 and a redundancy data bus connected to the memory cell array 1201. The selector 1205 receives hit flags output by the comparator 1204, I/O information (input/output information) stored in the memory cell array 1201, and redundancy data stored in a data section of the memory cell array 1201 for displacement of memory cells, and based on these information, the selector 1205 selectively outputs one of the data stored in the DRAMs 11 and the redundancy data stored in the memory cell array 1201. The write buffer 1206 performs buffering of write data transmitted from the non-volatile memory 1200 to the memory cell array 1201.

In this controller 12*a*, when the system is switched on, the address information of the inferior memory cells having poor data retention characteristics is read out from the non-volatile memory and is written in the memory cell array 1201 via the write buffer 1206. When the DRAMs 11 are accessed from the outside, data in the memory cell array 1201 and address input from the external address bus via the address buffer 1111 is collated with each other according to a set associative method. If the collation results in a hit, a hit flag output by the comparator rises, and the selector performs bit substitution using the corresponding redundancy data stored in the memory cell array 1201. At that time, the address translator 1203 selects, based on address translation information, one of the index side or the tag side for the input of addresses.

In this embodiment, when an address is input from the outside, the selector 1205 selects either the DRAMs 11 or the memory cell array 1201 based on the address, and reading or writing of data is performed with regard to the selected one. Therefore, the access from the outside is not influenced by the memory cell displacement function.

The address translation by the address translator 1203 can be optionally modified by changing the address translation information stored in the non-volatile memory 1200. Therefore, in this embodiment, the address translation can be individually controlled for each device in accordance with the result of the characteristic test of the device. The fixed address region in the set associative method should be adjusted in accordance with the distribution of the inferior memory cells to be displaced in the address space. Also, it is preferable to perform refresh operations in the memory cell array at a frequency which is larger than that in each DRAMs 11, in order to maintain the retention time of the memory cell array 1201 at more than a predetermined value.

The memory cell array 1201 has an I/O bus independent from that of the DRAMs 11 in the present embodiment. However, the memory cell array 1201 may be incorporated in the same chip as that of the DRAMs 11. That is, the memory cell array 1201 and the DRAM 11 may be formed on the same chip.

As is explained above referring to the various embodiments, according to the present invention, when in a stand-by state, it is possible to supply the voltage to be consumed by internal circuits of DRAMs for data retention from the external power supply while halting at least a part of the internal power supply circuits in the DRAMs. Therefore, the current consumption by the internal power supply circuits can be omitted, and the data retention current of the DRAMs can be reduced. This is due to the reason that the present invention can reduce the number of the internal power supply circuits working in a stand-by state. Furthermore, the present invention can reduce the frequency of self-refresh operations with regard to the compensated capacity time.

In comparison with the first embodiment of the present invention shown in FIG. 1 and the conventional art shown in FIG. 17, the present embodiment comprises characteristic features that both each DRAM and a controller comprise the internal power supply circuit (HVC circuit) and a HVC_EXT pin, and that a switching circuit is provided in each DRAM for switching the internal HVC circuit and the external HVC circuit based on a sleep signal. The conventional memory system does not comprise these features. That is, in the conventional memory system, a HVC circuit is provided only in each DRAM, and is not provided in the controller. Furthermore, the conventional memory system does not comprises a mechanism for switching the HVCC circuit.

What is claimed is:

1. A semiconductor storage device comprising:
   a plurality of memory cells;
   an internal power supply circuit that generates an internal voltage from a supply voltage supplied from outside so as to supply the internal voltage to the memory cells via an output node;
   an internal power supply stop circuit that halts the internal power supply circuit when the memory cells are in a data retention state and are not engaged in a refresh operation;
   wherein the output node is constructed so that the output node can be connected to an external power supply via an external power supply terminal.

2. The semiconductor storage device according to claim 1, further comprising a switch for connection and disconnection between the output node and an external power supply terminal.

3. The semiconductor storage device according to claim 2, further comprising a control circuit that turns the switch on when the plurality of memory cells are in a stand-by state and are not engaged in a refresh operation.

4. The semiconductor storage device according to claim 1, wherein the internal voltage generated by the internal power supply circuit is different from a supply voltage supplied to the memory cells, and the internal voltage is at least one of a voltage between the supply voltage and a ground voltage, a minus voltage lower than the ground voltage, and a voltage higher than the supply voltage.

5. The semiconductor storage device according to claim 1, wherein the internal voltage generated by the internal power supply circuit is a voltage between the supply voltage and a ground voltage, and the internal voltage is applied to one end of each capacitor included in each of the memory cells.

6. The semiconductor storage device according to claim 1, wherein the internal voltage generated by the internal power supply circuit is a minus voltage lower than a ground voltage, and the internal voltage is applied to a back gate terminal of each MOS transistor included in each of the memory cells.

7. A semiconductor storage system comprising:
   a plurality of semiconductor storage devices, wherein each of the semiconductor storage devices comprising a plurality of memory cells; an internal power supply circuit that generates an internal voltage from a supply voltage supplied from outside so as to supply the internal voltage to the memory cells via an output node; an internal power supply stop circuit that halts the internal power supply circuit when the memory cells are in a data retention state and are not engaged in a refresh operation; wherein the output node is constructed so that the output node can be connected to an external power supply via an external power supply terminal; and
   wherein the external power supply terminals of the semiconductor storage devices are respectively connected to each other so that the output nodes of the semiconductor storage devices can be connected to each other by switches.

8. The semiconductor storage system according to claim 7, wherein the system is constructed so that one of the following two states can be selected:
   (i) a first state in which, one of the semiconductor storage devices is selected as a master and the others are selected as slaves, the internal power supply circuit of the master is activated, the switches are turned on to connect the output nodes to each other, and the internal power supply stop circuits of the slaves are activated to halt the internal power supply circuits of the slaves; and
   (ii) a second state in which the internal power supply circuits of the semiconductor storage devices are activated and the switches are turned off to disconnect the output nodes to each other.

9. The semiconductor storage system according to claim 8, further comprising an arbitrator circuit that dynamically selects the master and the slaves among the semiconductor storage devices.

10. The semiconductor storage system according to claim 9, wherein the arbitrator circuit controls the semiconductor storage devices so that refresh operations are performed only in the semiconductor storage devices selected as slaves.

11. The semiconductor storage system according to claim 10, wherein the arbitrator circuit turns off the switches of the slaves when the slaves perform the refresh operations.

12. The semiconductor storage system according to claim 7, further comprising a power supply device that supplies, to the external power supply terminals of the semiconductor storage devices, the same voltage as that generated by the internal power supply circuits.

13. The semiconductor storage system according to claim 7, further comprising a displacement circuit that displaces memory cells which have poor data retention characteristics with redundant memory cells.

14. The semiconductor storage system according to claim 12, further comprising a displacement circuit that displaces memory cells which have poor data retention characteristics with redundant memory cells, and the displacement circuit is integrated with the power supply device.

* * * * *